United States Patent [19]
Blom et al.

[11] Patent Number: 5,879,590
[45] Date of Patent: Mar. 9, 1999

[54] LOW CONDUCTIVITY, DOPED KTIOPO₄ AND DEVICES BASED THEREON

[75] Inventors: Gerard M. Blom, Ossining, N.Y.; George Kostecky, Mahwah, N.J.; Thomas F. McGee, Peekskill, N.Y.; Richard Stolzenberger, Mahwah; Gabriel M. Loiacono, Franklin Lakes, both of N.J.

[73] Assignee: North American Philips Corporation, New York, N.Y.

[21] Appl. No.: 553,475

[22] Filed: Jul. 13, 1990

[51] Int. Cl.$^6$ .............................. G02B 5/20; G30B 9/00; G02F 1/00
[52] U.S. Cl. ............................ 252/584; 252/582; 117/80; 385/141; 359/322; 359/326
[58] Field of Search ................................. 252/582, 584; 385/141; 359/322, 326; 117/80

[56] References Cited

U.S. PATENT DOCUMENTS

| | | | |
|---|---|---|---|
| 4,740,265 | 4/1988 | Bierlein et al. | 385/131 |
| 4,766,954 | 8/1988 | Bierlein et al. | 385/131 |
| 4,917,451 | 4/1990 | Chouinard et al. | 385/141 |
| 4,935,844 | 6/1990 | Burn | 361/321 |
| 5,084,206 | 1/1992 | Ballman et al. | 252/584 |
| 5,326,423 | 7/1994 | Ballman et al. | 252/584 |

*Primary Examiner*—Shean C. Wu
*Attorney, Agent, or Firm*—Steven R. Biren

[57] ABSTRACT

A method for forming relatively large and inexpensive crystals of KTiOPO₄, which exhibit relatively low conductivities, is disclosed. In addition, electro-optic devices based on such crystals are also disclosed.

32 Claims, 10 Drawing Sheets

LOW CONDUCTIVITY, DOPED KTIOPO$_4$ AND DEVICES BASED THEREON

BACKGROUND OF THE INVENTION

1. Field of the Invention

The invention pertains generally to substantially single-crystal material having a composition which includes KTiOPO$_4$ and to electro-optic devices based thereon.

2. Description of Related Art

Substantially single-crystal KTiOPO$_4$ (which compound is hereinafter referred to as KTP) is a relatively new material which exhibits many attractive optical properties, including relatively large electro-optic coefficients. As a consequence, this material has been proposed for use in a number of electro-optic devices, in which relatively large electric fields are necessarily employed.

At present, there are two methods available for growing substantially single-crystal KTP. In the first of these methods, known as the hydrothermal technique, a nutrient and a seed crystal are sealed in a gold tube, and the tube is inserted into a high pressure-high temperature autoclave. Crystals are then grown at a relatively high constant pressure of, for example, 25,000 psi and at a constant temperature with a fixed temperature gradient, e.g., 600° Centigrade (C.) at the nutrient end and 550° C. at the seed end. (Regarding the hydrothermal technique see, e.g., G. Gashurov et al, "Growth of KTP", in *Tunable Solid State Lasers for Remote Sensing*, R. L. Byer, E. K. Gustafson and R. Frebino, eds. (Springer-Verlag, New York, 1985), p. 119). While the resulting KTP crystals are of high quality, it has thus far only been possible to grow relatively small crystals. In addition, the need to employ high pressures has resulted in these crystals being relatively expensive.

The second method available for growing substantially single-crystal KTP is a high-temperature solution growth technique. In this second method, a melt is formed, typically at a temperature of 1050° C., in which reactants capable of reacting to form KTP are dissolved in a solvent having the nominal composition K$_6$P$_4$O$_{13}$. The KTP is crystallized out of solution by initially lowering the melt temperature to, for example, 960° C., inserting a seed crystal of KTP and then cooling the melt at a rate of, for example, 5° C. per day while alternately rotating the seed in the clockwise and counter-clockwise directions. (Regarding the high-temperature solution growth technique see P. F. Bordui et al, "Growth of Large Single Crystals of KTiOPO$_4$ (KTP) From High-Temperature Solution Using Heat Pipe Based Furnace System", Journal of Crystal Growth, Vol. 84, 1987, pp. 403–408). Significantly, this procedure yields relatively large crystals. In addition, because this procedure is carried out at atmospheric pressure, the resulting crystals are relatively inexpensive.

The morphologies of the KTP crystals produced by the hydrothermal technique and the high-temperature solution growth technique are similar. In addition, the optical properties, including the electro-optical properties, are also similar. However, the crystals grown by the two techniques differ significantly in one important electrical property. That is, for the sake of convenience, the [100] crystallographic direction is here defined as the x-axis, the [010] crystallographic direction is here defined as the y-axis and the [001] crystallographic direction is here defined as the z-axis. These definitions correspond to the lattice parameters of the (orthorhombic) crystal structure having space group Pn2a$_1$, the number of molecules per unit cell being 8, the lattice parameters being a=12.818 Angstroms, b=6.404 Angstroms and c=10.59 Angstroms, and the x-, y- and z- axes being associated with, respectively, the a, b and c lattice parameters. With this definition in mind, it is to be noted that KTP crystals grown via both the hydrothermal and high-temperature solution growth techniques exhibit a conductivity in the z-direction, much higher than that in the x- and y- directions, believed due to the transport of K$^+$ ions in the z-direction. This transport is, in turn, believed due to the presence of vacancies at the K$^+$ sites in the crystal lattice. Significantly, the ionic conductivity of a KTP crystal grown via the low-temperature hydrothermal technique is usually relatively low, often as low as about 1×10$^{-9}$ Siemen's units per centimeter (S/cm). On the other hand, the ionic conductivity of a KTP crystal grown via the high-temperature solution growth technique is usually relatively high, typically being about 2×10$^{-6}$ S/cm. This difference in z-direction conductivities is important because the electro-optic coefficients associated with the z-direction are relatively large, and therefore, for electro-optic applications, it is often desirable to apply the electric field in the z-direction. But the relatively high z-direction ionic conductivity exhibited by KTP crystals grown via the high-temperature solution growth technique implies that such crystals cannot sustain the relatively high electric fields needed for many electro-optic applications.

Although not specifically directed to lowering ionic conductivities, experiments have been conducted by others in which Ba$^{+2}$ dopant ions have been substituted for K$^+$ ions in KTP crystals. However, rather than lowering the ionic conductivities of the crystals, this substitution increased the ionic conductivities.

Thus, those engaged in developing electro-optic devices have sought, thus far without success, KTP crystals which are relatively large and inexpensive and exhibit relatively low conductivities, particularly in the z-direction.

SUMMARY OF THE INVENTION

The invention involves the finding that the ionic conductivity of a KTP crystal grown via the high-temperature solution growth technique is readily and significantly lowered by ion substitution. However, this is not achieved by substituting dopant ions for K$^+$ ions. Rather, this is achieved by partially substituting dopant ions for Ti$^{+4}$ ions (titanium ions in KTP crystals have valences of +4). Moreover, these dopant ions must have a valence of +3, +2 or +1, preferably +3 or +2, and an ionic radius which is within 50 percent of the ionic radius of Ti$^{+4}$, i.e., the ionic radius can be as much as 50 percent larger or as much as 50 percent smaller than that of Ti$^{+4}$. Useful dopant ions include, for example, Cr$^{+3}$, Ga$^{+3}$, Al$^{+3}$, and Mg$^{+2}$.

For electro-optic applications, it has been determined that the ionic conductivity of a KTP crystal, particularly in the z-direction, should be equal to or less than about 2×10$^{-8}$ S/cm and preferably equal to or less than about 2×10$^{-9}$ S/cm. A procedure for determining the concentration of a useful dopant ion in the crystal needed to achieve a particular conductivity, as well as the corresponding concentration in the melt, is described below.

BRIEF DESCRIPTION OF THE DRAWINGS

The invention is described with reference to the accompanying drawings, wherein.

DETAILED DESCRIPTION OF THE PREFERRED EMBODIMENTS

The invention involves relatively large and inexpensive KTP crystals grown via the high-temperature solution growth technique, which exhibit relatively low conductivities. The invention also involves electro-optic devices which employ such crystals.

As noted above, the invention is based upon the finding that the ionic conductivity of a KTP crystal, particularly in the z-direction, is readily and significantly lowered by partially substituting dopant ions for the $Ti^{+4}$ ions in the crystal. In addition, to be useful, these dopant ions should have a valence of +3, +2 or +1, preferably +3 or +2, and an ionic radius which is within 50 percent of that of $Ti^{+4}$. In this regard, it must be emphasized that for purposes of the present invention, the ionic radius of an ion is defined relative to the ionic radius of 6-fold coordinated $O^{-2}$ being 1.4 Angstroms, the standard employed in the tables of (effective) ionic radius given in R. D. Shannon and C. T. Prewitt, Acta Crystallographica (1969) B25, pp. 928–929. Based upon this standard, and as listed in the Shannon/Prewitt tables, the ionic radius of $Ti^{+4}$, which is 6-fold coordinated in KTP, is 0.605 Angstroms. Thus, a useful dopant ion must have an ionic radius which is 0.605±0.303 Angstroms. Dopant ions which have such an ionic radius (and which meet the above valency requirement) are readily found in the Shannon/Prewitt tables. Included among the useful dopants are, for example, $Cr^{+3}$, $Ga^{+3}$, $Al^{+3}$ and $Mg^{+2}$.

The invention not only involves the above finding, but also involves a procedure for determining the concentration of any useful dopant ion in the crystal needed to achieve a particular conductivity. In this regard, a variety of useful dopant ions have been incorporated into KTP crystals, at different concentrations, via a modified version of the high-temperature solution growth technique, as discussed more fully below. In addition, the resulting conductivities in the z-direction have been measured by applying known voltages to the crystals and measuring the corresponding currents. The resulting data for $Cr^{+3}$, $Al^{+3}$ and $Ga^{+3}$ is shown in FIGS. 1 and 2.

Figure 1:
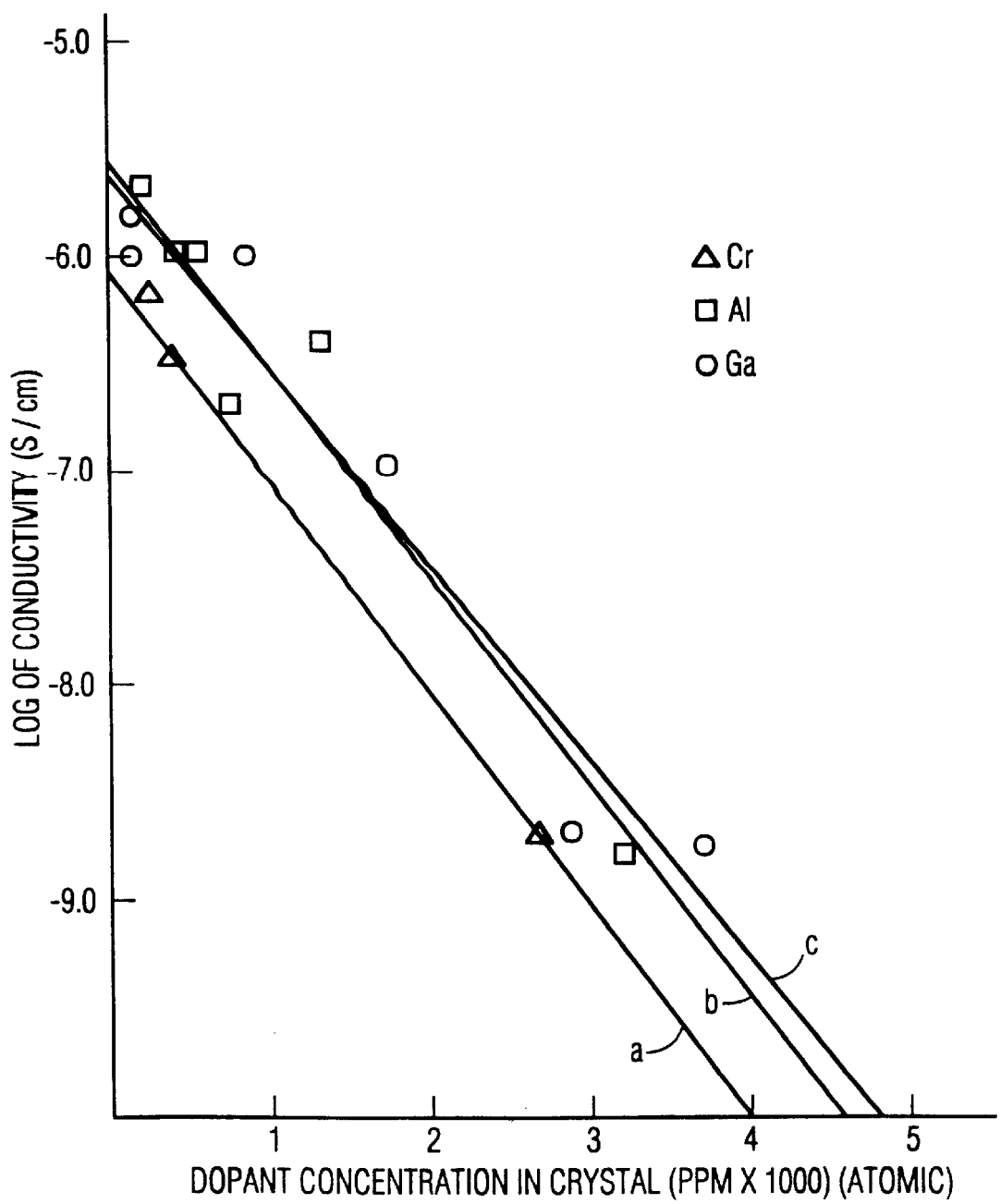
FIGS. 1 and 2 present plots of dopant concentration in crystal in units of parts per million atomic (PPMA) based on KTP versus logarithm (base 10) of corresponding conductivity in the z-direction in units of Siemen's units per centimeter (S/cm) for Cr, Al and Ga.

As shown in FIG. 1, the concentration of $Cr^{+3}$, $Al^{+3}$ and $Ga^{+3}$ ions, in units of parts per million atomic (PPMA) in the crystal, have been plotted versus the logarithm (base 10) of the corresponding conductivity in the z-direction, in S/cm units. In addition, the solid lines labeled a, b and c denote linear-least-squares-fit approximations to the data corresponding to, respectively, $Cr^{+3}$, $Al^{+3}$ and $Ga^{+3}$.

If it is desired to substitute $Cr^{+3}$, $Al^{+3}$ or $Ga^{+3}$ ions for $Ti^{+4}$ ions, then the concentration of $Cr^{+3}$, $Al^{+3}$ or $Ga^{+3}$ in the crystal needed to achieve a particular conductivity is readily determined either by resorting to the raw data plotted in FIG. 1 or to the solid lines labeled a, b and c. It should be noted that if one or more of the solid lines is employed, then the dopant concentration needed to achieve a particular conductivity, as inferred from one of the solid lines, may have to be empirically adjusted because the solid lines are, after all, merely approximations.

Figure 2:
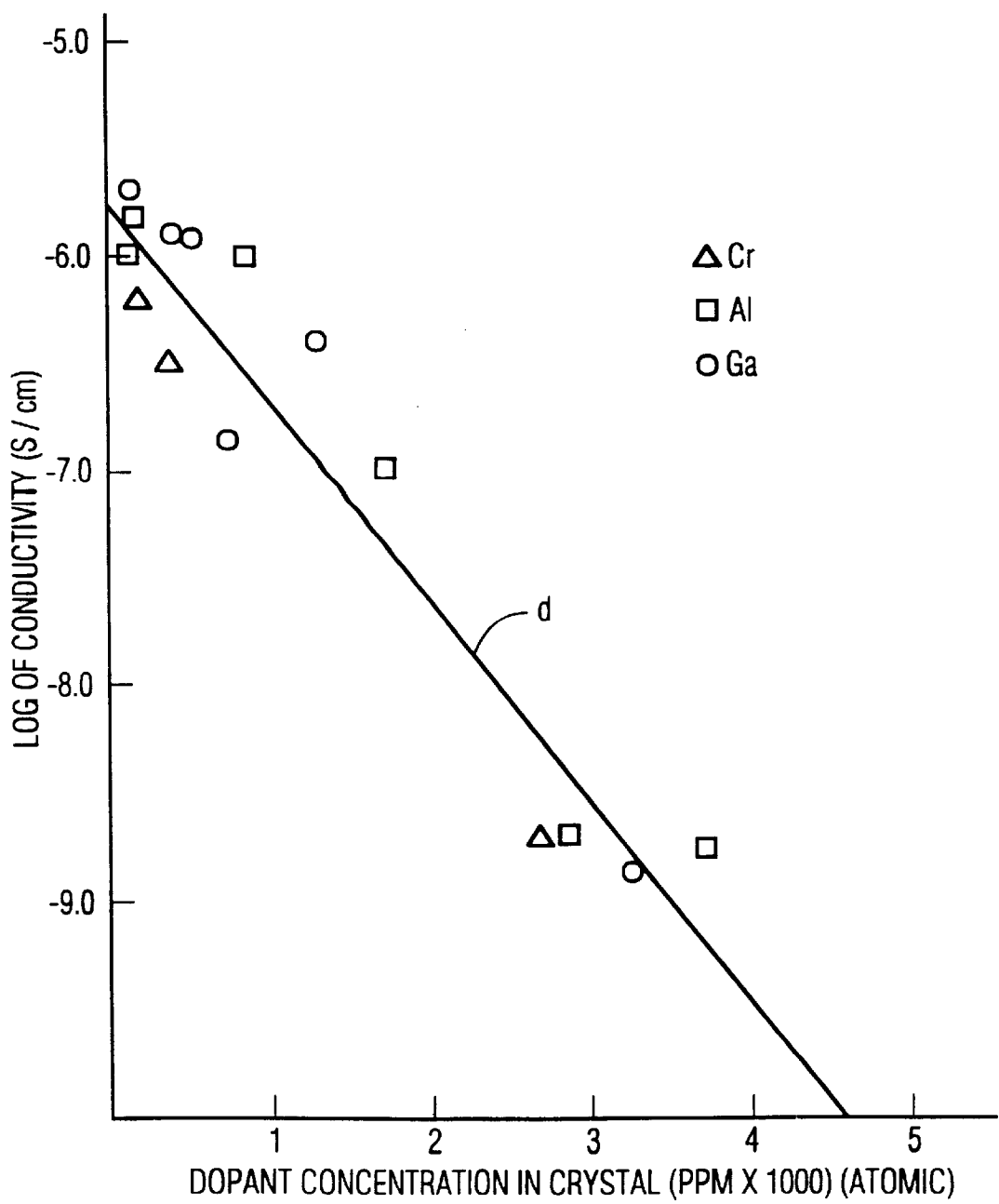

FIG. 2 is similar to FIG. 1 in that it includes plots of dopant concentration in the crystal versus the logarithm (base 10) of the corresponding conductivity in the z-direction for $Cr^{+3}$, $Al^{+3}$ and $Ga^{+3}$. Significantly, it has been found that all the data for all these dopants, as well as all other useful dopants having a valence of +3, is well approximated by a single linear-least-squares-fit approximation, shown as a solid line labeled d in FIG. 2. Thus, the concentration of any dopant ion having a valence of +3 needed to achieve a particular conductivity is readily determined by reference to the solid line labeled d. As before, because the solid line represents an approximation, empirical adjustments to dopant concentration may be needed to achieve a particular conductivity.

The solid line labeled d in FIG. 2 is further significant because it also permits one to determine the concentration of a dopant ion in the crystal having a valence of +2 or +1 needed to achieve a particular conductivity. That is, it has been found that the concentration of a dopant ion having a valence of +2 needed to achieve a particular conductivity is approximately half that of a dopant ion having a valence of +3. In addition, it has also been found that the concentration of a dopant ion having a valence of +1 needed to achieve a particular conductivity is approximately one-third that of a dopant ion having a valence of +3. Thus, to determine the concentration of a dopant ion having a valence of +2 needed to achieve a particular conductivity, one employs the solid line labeled d in FIG. 2 to determine the corresponding concentration for a dopant ion having a valence of +3, and divides this concentration value by two. Similarly, to determine the concentration of a dopant ion having a valence of +1 needed to achieve a particular conductivity, one employs the solid line labeled d in FIG. 2 to determine the corresponding concentration for a dopant ion having a valence of +3, and divides this concentration value by three.

It should be noted that not only is it useful to partially substitute just one dopant ion for $Ti^{+4}$, but it is also useful to partially substitute two or more different dopant ions for $Ti^{+4}$.

As noted above, it has been determined that for electro-optic applications, the conductivity of a KTP crystal, particularly in the z-direction, should be equal to or less than about $2 \times 10^{-8}$ S/cm and preferably equal to or less than about $2 \times 10^{-9}$ S/cm. Based upon the solid line labeled d in FIG. 2, the concentration of a dopant ion having a valence of +3 needed to achieve a conductivity of $2 \times 10^{-8}$ S/cm is roughly 2,200 PPMA. Consequently, the concentration of a dopant ion having a valence of +2 needed to achieve the same conductivity would be roughly 1,100 PPMA, while the concentration of a dopant ion having a valence of +1 needed to achieve the same conductivity would be roughly 733 PPMA. It must be emphasized that these concentration values are rough approximations, intended only to exemplify the dopant concentration levels associated with the present invention, and that the concentration of a particular dopant ion needed to achieve a conductivity of $2 \times 10^{-8}$ S/cm may differ somewhat from these concentration values.

It should be noted that KTP crystals fabricated in the past, either by the conventional hydrothermal technique or the conventional high-temperature solution growth technique, do contain impurity levels of some of the dopant ions associated with the present invention. However, the concentrations of dopant ions required to achieve a conductivity equal to or less than $2 \times 10^{-8}$ S/cm is far higher, typically at least 25 times higher, than these impurity levels. As a consequence, KTP crystals encompassed by the present invention are readily distinguished from previous KTP crystals through standard chemical analysis techniques, e.g. arc source emission spectroscopy.

Useful dopant ions are readily incorporated into KTP crystals by modifying the standard high-temperature solution growth technique. That is, in the standard technique, liquid $K_6P_4O_{13}$ (the solvent for the KTP) is formed by reacting $KH_2PO_4$ with $K_2HPO_4$, i.e.,

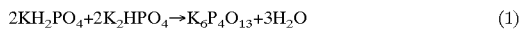
(1)

In addition, $KH_2PO_4$ is reacted with $TiO_2$ to form KTP, which is then dissolved in the $K_6P_4O_{13}$, i.e.,

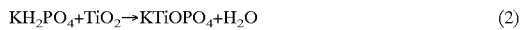
(2)

In practice the relevant quantities of $KH_2PO_4$, $K_2HPO_4$ and $TiO_2$, usually in powder form, are simultaneously placed in a crucible. The crucible is then heated to a temperature of, for example, 1,050° C. to form a liquid melt in which the reactions recited in EQS. (1) and (2) are believed to proceed simultaneously and in which the KTP is dissolved in the $K_6P_4O_{13}$. After initially cooling the melt to a temperature of, for example, 960° C., a KTP seed crystal is placed in the melt. The melt is then cooled at a rate of, for example, 5° C. per day, while alternately rotating the seed in the clockwise and counterclockwise directions, to crystallize the KTP out of solution about the seed crystal.

To incorporate a dopant ion into a KTP crystal, in accordance with the invention, an appropriate amount of the corresponding dopant oxide is added to the melt, and the amount of $TiO_2$ is either correspondingly reduced or, if so desired, is unchanged. Thus, if, for example, $Cr^{+3}$ is to be partially substituted for $Ti^{+4}$, then $Cr_2O_3$ is added to the melt. Similarly, if $Al^{+3}$ is to be partially substituted for $Ti^{+4}$, then $Al_2O_3$ is added to the melt, and so on.

Knowing the required concentration of a dopant ion in a KTP crystal does not, of itself, automatically determine the relevant amount of dopant oxide to be added to the melt. That is, the amount of dopant oxide to be added to the melt is also determined by the corresponding distribution coefficient, K, which is conventionally defined as the ratio of the dopant concentration in the solid (in the KTP crystal), $C_s$, to the dopant concentration in the liquid (in the melt), $C_l$, i.e., $$K = C_s/C_l \quad (3)$$

Because, in the present case, the dopant ion substitutes for Ti in the KTP crystal, it is more convenient to define a relative distribution coefficient in which the dopant concentrations in the solid and the liquid are defined relative to the concentrations of Ti in the solid and the liquid. Thus, for purposes of the present discussion, it is to be understood that $C_s$ in Eq. (3) denotes the atomic ratio of the concentration of dopant to the concentration of Ti in the solid, and $C_l$ in Eq. (3) denotes the atomic ratio of dopant concentration to the concentration of Ti in the liquid.

In general, the distribution coefficients (as defined above) for the dopant ions encompassed by the present invention vary according to dopant ion and dopant concentration in the crystal. This is readily apparent from the data presented in Table I, on the following page, in which the measured values of $C_s$, $C_l$ and the corresponding distribution coefficients for Cr, Ga, Al and Mg, for different dopant concentrations are presented. Plots of the measured values of $C_s$ versus the measured values of $C_l$, and corresponding linear-least-squares-fit approximations to the measured data, for Cr, Al and Ga have been prepared and are presented in, respectively, FIG. 3, FIG. 4 and FIG. 5. Based upon these plots, one can readily determine, for these particular dopant ions, the amount of dopant oxide to be added to the melt once the dopant concentration in the crystal has been decided upon.

TABLE I

| | | | Growth and Electrical Data | | | |
|---|---|---|---|---|---|---|
| Dopant | PPM in Crystal | Dopant/Ti (Solution) | Dopant/Ti (Crystal) | Distribution Coefficient | Conductivity (S/cm) | Growth Temperature Range(°C.) |
| Cr | 50 | $2.63 \times 10^{-4}$ | $1.92 \times 10^{-4}$ | $7.30 \times 10^{-1}$ | $8.0 \times 10^{-7}$ | 967–944 |
| Cr | 100 | $5.26 \times 10^{-4}$ | $3.84 \times 10^{-4}$ | $7.30 \times 10^{-1}$ | $5.0 \times 10^{-7}$ | 963–931 |
| Cr | 700 | $2.63 \times 10^{-3}$ | $2.69 \times 10^{-3}$ | $1.02 \times 10^{0}$ | $3.0 \times 10^{-9}$ | 962–935 |
| Ga | 50 | $5.03 \times 10^{-3}$ | $1.43 \times 10^{-4}$ | $2.84 \times 10^{-2}$ | $2.0 \times 10^{-6}$ | 954–936 |
| Ga | 50 | $1.00 \times 10^{-2}$ | $1.43 \times 10^{-4}$ | $1.43 \times 10^{-2}$ | $1.0 \times 10^{-6}$ | 956–935 |
| Ga | 300 | $3.11 \times 10^{-2}$ | $8.60 \times 10^{-4}$ | $2.77 \times 10^{-2}$ | $1.0 \times 10^{-6}$ | 953–930 |
| Ga | 600 | $5.26 \times 10^{-2}$ | $1.72 \times 10^{-3}$ | $3.27 \times 10^{-2}$ | $1.0 \times 10^{-7}$ | 943–924 |
| Ga | 1000 | $1.11 \times 10^{-1}$ | $2.87 \times 10^{-3}$ | $2.58 \times 10^{-2}$ | $3.0 \times 10^{-9}$ | 946–898 |
| Ga | 1300 | $1.76 \times 10^{-1}$ | $3.73 \times 10^{-3}$ | $2.12 \times 10^{-2}$ | $2.5 \times 10^{-9}$ | 938–893 |
| Ga* | 1000 | $1.50 \times 10^{-1}$ | $2.87 \times 10^{-3}$ | $1.91 \times 10^{-2}$ | $2.0 \times 10^{-9}$ | 968–922 |
| Al | 20 | $4.93 \times 10^{-3}$ | $1.48 \times 10^{-4}$ | $3.00 \times 10^{-2}$ | $3.0 \times 10^{-6}$ | 961–940 |
| Al | 60 | $1.00 \times 10^{-2}$ | $4.44 \times 10^{-4}$ | $4.44 \times 10^{-2}$ | $1.1 \times 10^{-6}$ | 957–931 |
| Al | 70 | $3.11 \times 10^{-2}$ | $5.19 \times 10^{-4}$ | $1.67 \times 10^{-2}$ | $1.1 \times 10^{-6}$ | 946–915 |
| Al | 175 | $5.26 \times 10^{-2}$ | $1.30 \times 10^{-3}$ | $2.46 \times 10^{-2}$ | $6.0 \times 10^{-7}$ | 957–937 |
| Al | 100 | $1.11 \times 10^{-1}$ | $7.42 \times 10^{-4}$ | $6.68 \times 10^{-3}$ | $1.3 \times 10^{-7}$ | 943–921 |
| Al | 440 | $1.76 \times 10^{-1}$ | $3.26 \times 10^{-3}$ | $1.82 \times 10^{-2}$ | $2.3 \times 10^{-9}$ | 935–900 |
| Al* | 1050 | $2.50 \times 10^{-1}$ | $7.70 \times 10^{-3}$ | $3.11 \times 10^{-2}$ | $1.2 \times 10^{-9}$ | 957–919 |
| Al* | 250 | $1.50 \times 10^{-1}$ | $1.85 \times 10^{-3}$ | $1.23 \times 10^{-2}$ | $1.0 \times 10^{-8}$ | 966–946 |
| Mg | 30 | $1.40 \times 10^{-2}$ | $2.47 \times 10^{-4}$ | $1.76 \times 10^{-2}$ | — | 956–930 |
| Mg* | 30 | $5.01 \times 10^{-2}$ | $2.47 \times 10^{-4}$ | $4.93 \times 10^{-3}$ | — | 959–925 |
| Mg* | 150 | $1.50 \times 10^{-1}$ | $1.23 \times 10^{-3}$ | $8.20 \times 10^{-3}$ | $3.0 \times 10^{-7}$ | 962–936 |

Figure 3:
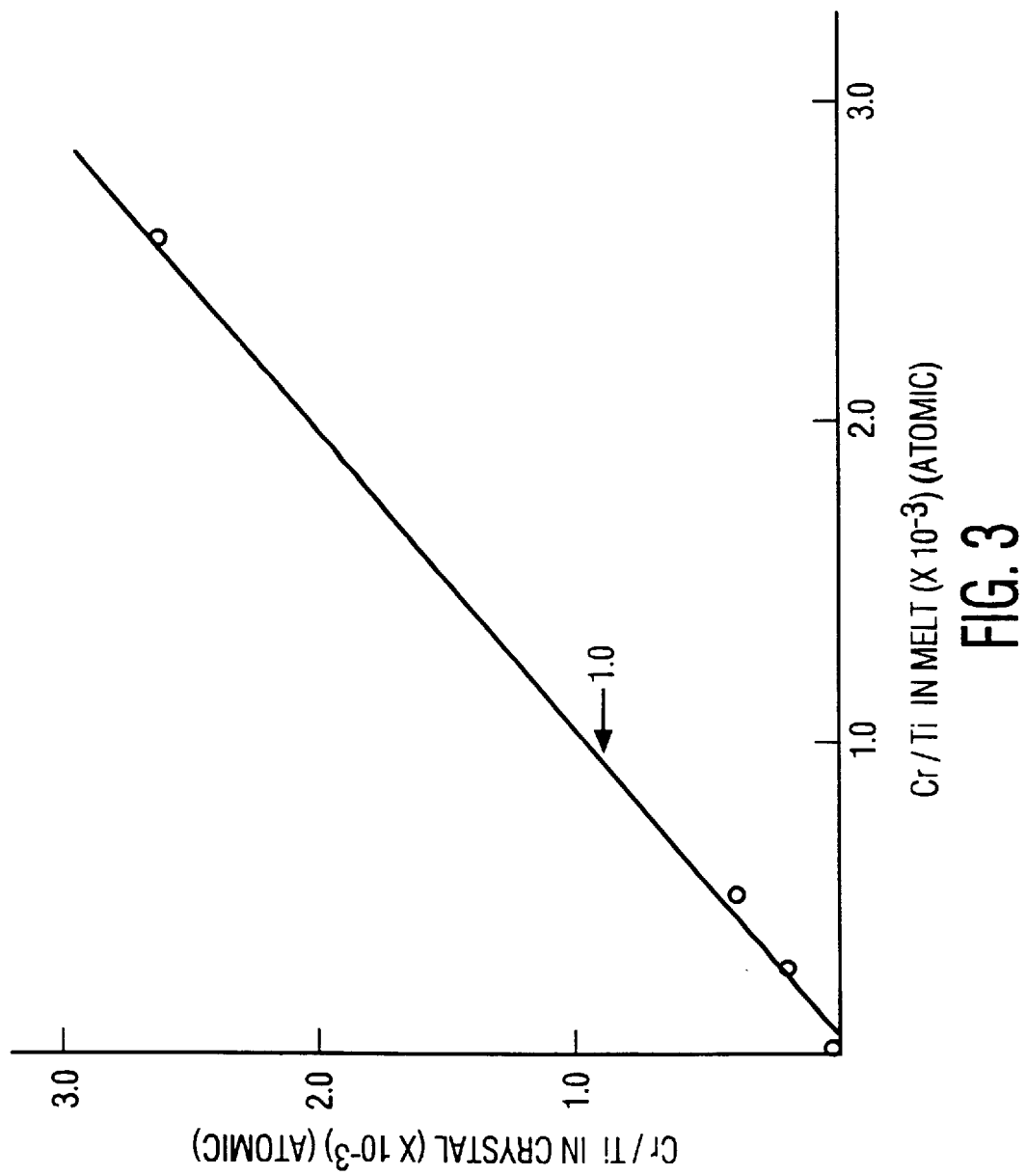
FIG. 3 presents a plot of the atomic ratio of the concentration of Cr to the concentration of Ti in the melt versus the corresponding atomic ratio of concentration of Cr to the concentration of Ti in the crystal.
Figure 4:
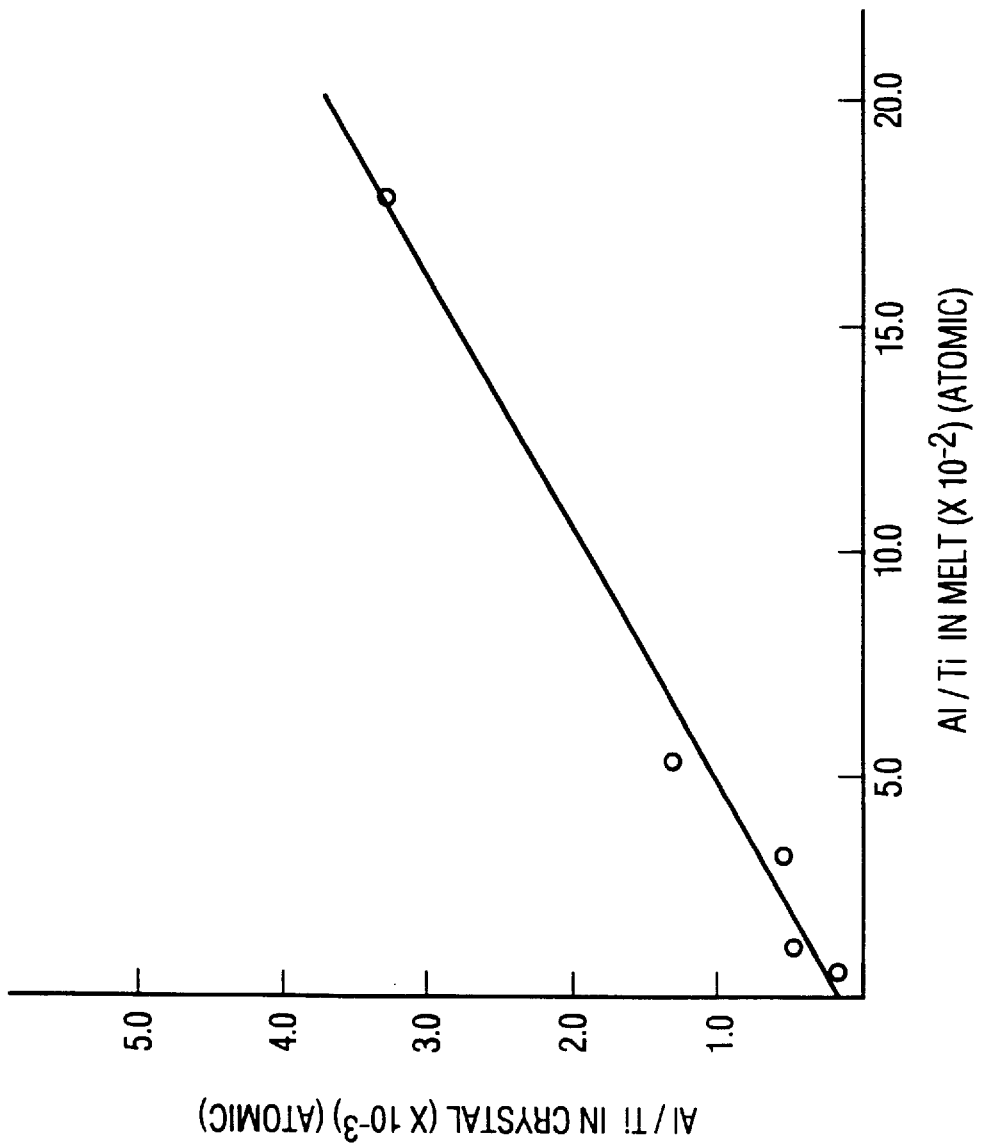
FIG. 4 presents a plot of the atomic ratio of the concentration of Al to the concentration of Ti in the melt versus the corresponding atomic ratio of concentration of Al to the concentration of Ti in the crystal.
Figure 5:
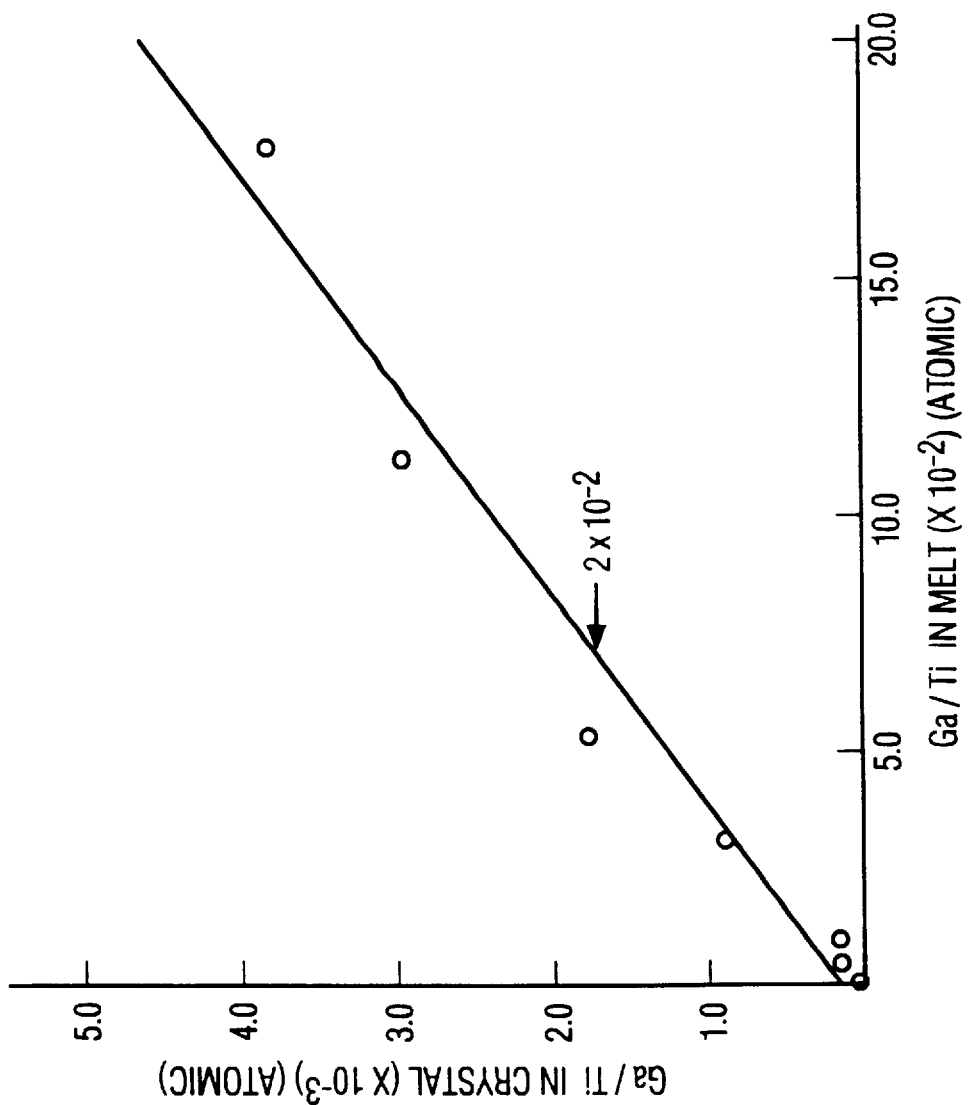
FIG. 5 presents a plot of the atomic ratio of the concentration of Ga to the concentration of Ti in the melt versus the corresponding atomic ratio of concentration of Ga to the concentration of Ti in the crystal.

* denotes the $TiO_2$ concentration in the solution was not lowered as the dopant was added In general, for a dopant ion other than Cr, Al or Ga, measurements must be made of dopant concentrations in the solid corresponding to known dopant concentrations in the liquid, and a plot similar to those shown in FIGS. 3–5 made. Given such a plot, the amount of dopant oxide to be added to the melt to achieve a particular dopant concentration in the crystal is readily determined.

Figure 6:
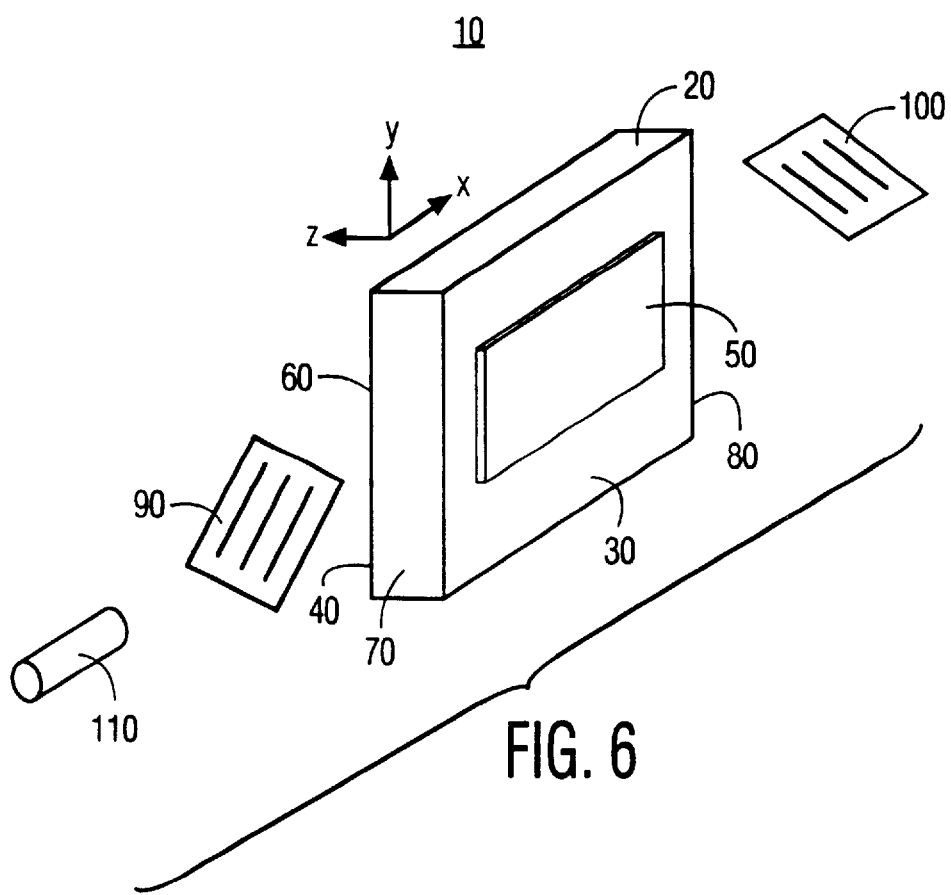
FIGS. 6–10 depict electro-optic devices encompassed by the present invention.

KTP crystals which have been doped, as described above, to achieve a conductivity equal to or less than about $2\times10^{-8}$ S/cm and preferably equal to or less than about $2\times10^{-9}$ S/cm, are useful in a variety of electro-optic devices encompassed by the present invention. One such device is, for example, a bulk optical modulator, depicted in FIG. 6. As shown, the modulator 10 includes a KTP crystal 20, doped in accordance with the invention, having the shape of, for example, a rectangular parallelepiped. The crystal 20 includes substantially parallel surfaces 30 and 40 which are, for example, transverse to the z-axis of the crystal. These surfaces bear electrical contacts 50 (shown) and 60 (not shown) which permit the application of a voltage in the z-direction. The electrical contacts are, for example, thin layers of silver paint having a thickness of, for example, 0.1 micrometers.

The modulator 10 also includes a polarizer 90 positioned so as to be capable of optical communication with a surface 70 of the crystal 20, which here serves as an input end of the crystal. The modulator 10 further includes an analyzer 100 which is transversely oriented to the polarizer. This analyzer is positioned so as to be capable of optical communication with a surface 80 of the crystal 20, which here serves as an output end of the crystal.

In operation, light from a source of electromagnetic radiation 110, e.g., a laser, is impinged upon the polarizer 90, which serves to transmit only linearly polarized light to the input end of the crystal 20. If no voltage is applied across the contacts 50 and 60, then the incident linearly polarized light is propagated through the crystal 20, without any change in polarization, to the analyzer 100, which blocks further propagation. If a voltage is applied across the contacts 50 and 60, then a birefringence is produced in the crystal. If the crystal is chosen to be of appropriate length, then the polarization of the incident linearly polarized light will be altered during the propagation of the light through the crystal, becoming elliptical, then circular, then elliptical and finally linear at the output end of the crystal. Significantly, the polarization of the linearly polarized light exiting the crystal will be at 90° to the incident light, and therefor the exiting light will be transmitted by the analyzer.

If the analyzer 100 is aligned with the polarizer 90, then in the absence of an applied voltage, light which propagates through the crystal will be transmitted by the analyzer 100. On the other hand, in the presence of an applied voltage, light which propagates through the crystal will be blocked by the analyzer.

Figure 7:
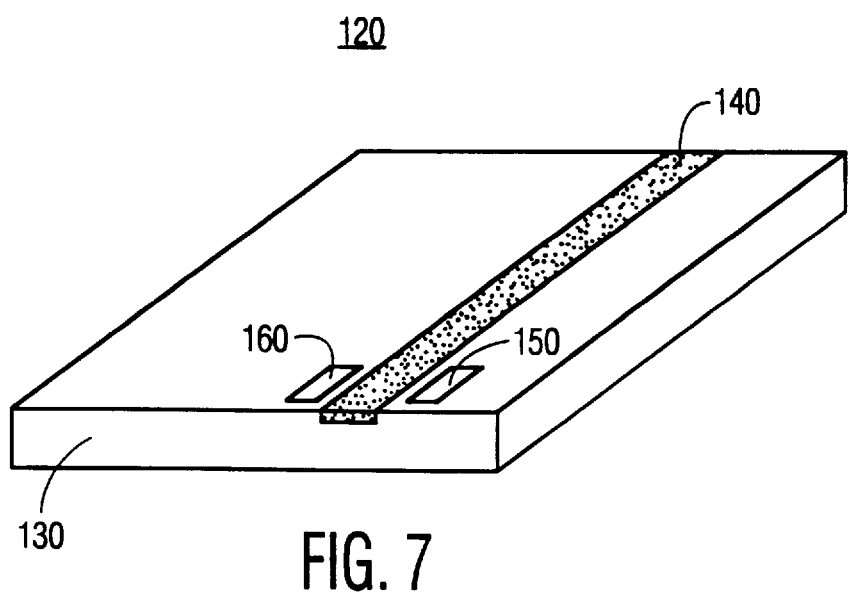

Another electro-optic device encompassed by the invention is the phase modulator depicted in FIG. 7. This phase modulator 120 includes a KTP crystal substrate 130, doped in accordance with the invention, in which a channel waveguide 140 has been formed in an upper surface of the substrate. Such a channel waveguide is formed by, for example, forming a patterned metal mask on the surface of the substrate, with the mask having open areas where the waveguide is to be formed. An ion-exchange bath, consisting of a molten nitrate salt of Rb, Cs or Tl, is heated to between 300° C. and 400° C., and the masked KTP substrate is immersed in the bath for a sufficient time to form the waveguide, typically 30 minutes to 4 hours.

The phase modulator 120 also includes electrical contacts 150 and 160 on the upper surface of the substrate 130, on opposite sides of the channel waveguide. These electrical contacts are, for example, thin layers of silver paint.

Figure 8:
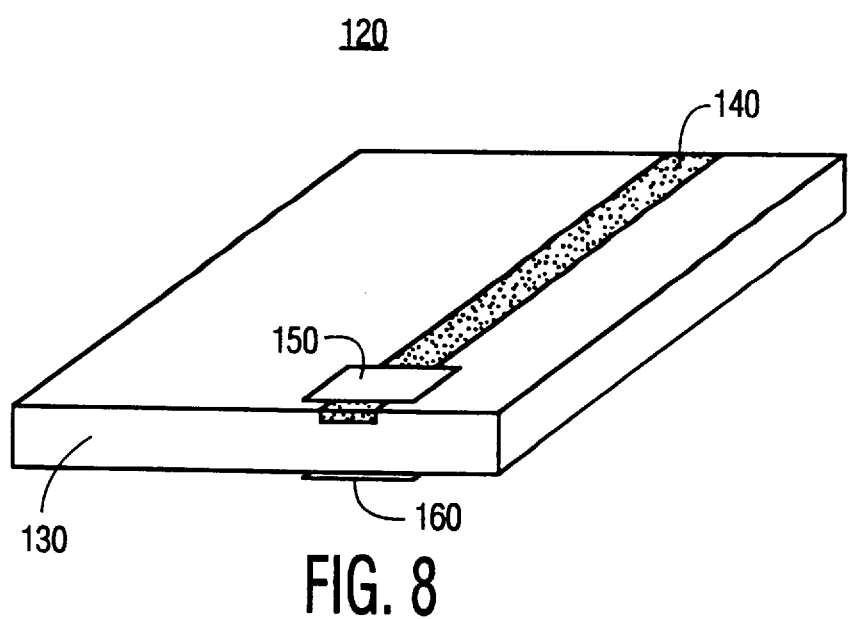

In another embodiment of the phase modulator 120, depicted in FIG. 8, the electrical contact 150 is formed on the upper surface of the substrate 130, overlying the channel waveguide 140, and the electrical contact 160 is formed on the lower surface of the substrate.

In the operation of the phase modulator 120, when light is injected into the channel waveguide 140, the application of a voltage across the contacts 150 and 160 serves to alter the local refractive index, and thereby alter the speed of propagation of the light through the channel waveguide.

Figure 9:
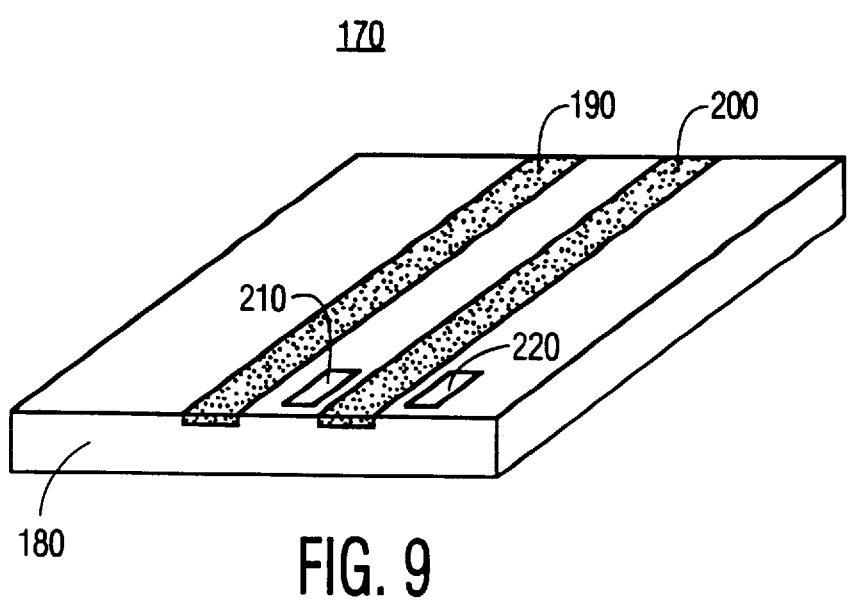

Yet another electro-optic device encompassed by the invention is the optical switch 170 depicted in FIG. 9. This switch includes a KTP crystal substrate 180 which has been doped in accordance with the invention. The switch also includes two, substantially parallel channel waveguides 190 and 200 formed in the upper surface of the substrate 180. In addition, the switch also includes electrical contacts 210 and 220 on the upper surface of the substrate, on opposite sides of the channel waveguide 200.

In operation, when light is injected into the channel waveguide 200, and a voltage is applied across the contacts 210 and 220, the local refractive index is altered and the light is then coupled from the waveguide 200 into the waveguide 190.

Figure 10:
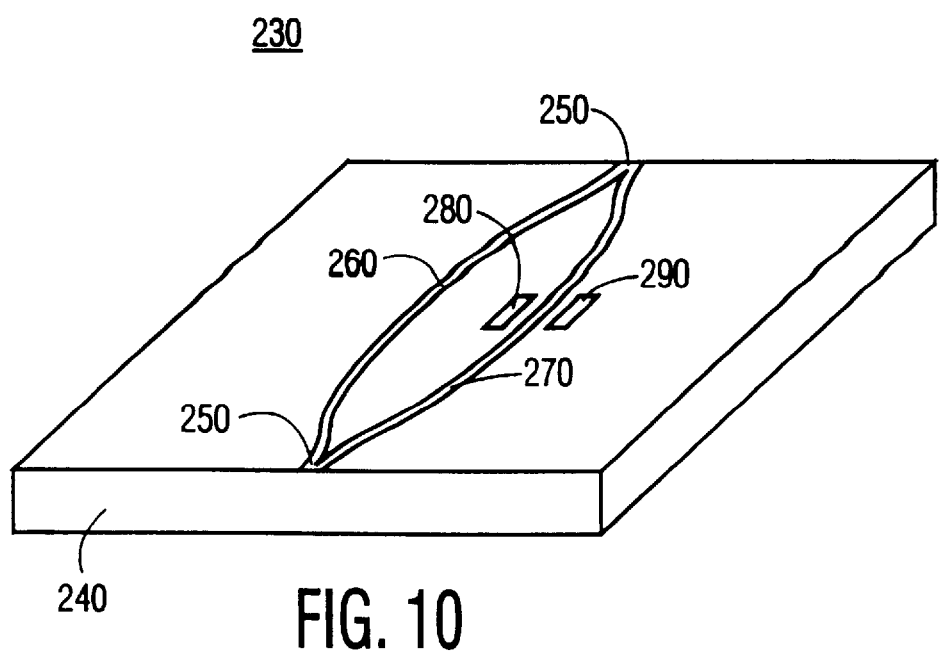

Still another electro-optic device encompassed by the present invention is the Mach-Zender type optical modulator 230 depicted in FIG. 10. A shown, this modulator includes a KTP crystal substrate 240 which has been doped in accordance with the invention. The modulator also includes a channel waveguide 250 formed in the upper surface of the substrate 240, which bifurcates into two channel waveguides 260 and 270 which, in turn, converge to once again form the single channel waveguide 250. Electrical contacts 280 and 290 are also provided on the upper surface of the substrate 240, on opposite sides of the channel waveguide 270.

In the operation of the modulator 230, light is propagated down the channel waveguide 250 (from left to right as viewed in FIG. 10), and is thus split into two light beams propagating through the channel waveguides 260 and 270. By applying a voltage across the electrodes 280 and 290, a local change in refractive index is produced, which affects only the light propagating through the channel waveguide 270. This change in refractive index will necessarily result in different propagation speeds for the light beams in the channel waveguides 260 and 270, resulting in a phase difference at the juncture of these channel waveguides. For an appropriate change in refractive index and appropriate lengths of the channel waveguides 260 and 270, a phase difference of $\pi$ is readily produced. As a consequence, the light beams will destructively interfere with one another at the juncture of the waveguides 260 and 270, with the resulting single beam having diminished intensity. Thus, by selectively applying voltages across the electrical contacts 280 and 290, light in the channel waveguide 250 is readily modulated.

It should be noted that the use of chromium dopant ions in one or more of the above electro-optic devices may, in some instances, be less desirable because the chromium ions introduce two absorption bands at visible wavelengths into the optical transmission properties of the corresponding KTP crystals. No such absorption bands exist at, for example, infrared wavelengths.

EXAMPLE 1

A KTP crystal doped with $Cr^{+3}$ ions was fabricated by initially pouring 294.63 grams of $KH_2PO_4$ into a high density polyethylene mixing container, followed by 79.70 grams of $TiO_2$ and 0.20 grams of $Cr_2O_3$, in turn followed by 202.90 grams of $KH_2PO_4$. A cover was placed on the mixing container, and the container was vigorously agitated by hand for five minutes.

The contents of the mixing container were then poured through a plastic funnel into a platinum preparation crucible which was 110 millimeters (mm) in diameter and 80 mm high. The filled preparation crucible was placed in a sintering furnace preheated to 1050°. After 17 hours, the preparation crucible was removed from the sintering furnace and its molten contents poured into a platinum growth crucible which was 80 mm in diameter and 70 mm high.

The filled growth crucible was lowered, via tongs, into a heat pipe growth furnace which was at 1000° C. A platinum stirrer was placed into the melt in the growth crucible and stirred for 4 hours at 70 rpm to insure homogeneity. The stirrer was removed and the temperature was lowered to the initial growth temperature, which was 962° C. The furnace was then allowed to equilibrate at the initial growth point for about 1 hour.

A KTP seed crystal, attached to a platinum seed rod, was lowered into the furnace, and allowed to equilibrate for 15 minutes. The seed crystal was then lowered into the melt, and allowed to sit in the melt without stirring for two hours. The seed crystal was then alternately rotated in the clockwise and counterclockwise directions, initially at 10 rpm and later at 50 rpm, while the temperature of the furnace was lowered at the rate of 5° C. per day. When the furnace temperature reached 935° C., the grown crystal was withdrawn from the melt, while remaining within the furnace.

The furnace was then cooled at 25° C. per hour to 50° C., the seed rod was removed from the furnace, the KTP crystal was placed in a beaker and hot water was run into the beaker to remove the flux remaining on the KTP crystal. The crystal was then weighed, measured and optically inspected for flaws and veils.

A plate which was 5 mm in the x-direction, 5 mm in the y-direction and 1 mm in the z-direction was excised from the grown crystal. Two surfaces of the plate transverse to the z-direction were ground and polished and silver paint electrical contacts were formed on these surfaces. By applying a know voltage across these contacts and measuring the resulting current, it was determined that the corresponding conductivity in the z-direction was $3 \times 10^{-9}$ S/cm.

Approximately 1 gram of the grown KTP crystal was subjected to arc source emission spectroscopy, from which it was determined that the concentration of $Cr^{+3}$ in the crystal was 2665 PMMA.

EXAMPLE 2

A KTP crystal doped with $Ga^{+3}$ ions was fabricated using the same general procedure used in Example 1. The only difference was that 71.92 grams of $TiO_2$ and 9.38 grams of $Ga_2O_3$ were poured into the mixing container. In addition, the growth temperature range was 946°–898° C.

The resulting $Ga^{+3}$-doped KTP crystal had a z-direction conductivity of $3 \times 10^{-9}$ S/cm and a dopant concentration of 2840 PPMA.

EXAMPLE 3

A KTP crystal doped with $Al^{+3}$ ions was fabricated using the same general procedure used in Example 1. The only difference was that 69.72 grams of $TiO_2$ and 7.65 grams of $Al_2O_3$ poured into the mixing container. In addition, the growth temperature range was 935°–900° C.

The resulting $Al^{+3}$-doped KTP crystal had a z-direction conductivity of $2.3 \times 10^{-9}$ S/cm and a dopant concentration of 3225 PMMA.

What is claimed is:

1. A device, comprising:
   a region of substantially single-crystal material having a composition which includes $KTiOPO_4$, the Ti in the crystal lattice of said material being in ionic form and having a valence of +4, said region including first and second substantially parallel surfaces and first and second ends; and
   a first electrical contact in electrical contact with said first surface and a second electrical contact in electrical contact with said second surface, characterized in that
   said Ti is partially substituted with one or more dopant ions having a valence of +3, +2 or +1 and an ionic radius which is within 50 percent of the ionic radius of said Ti, the concentration of said one or more dopant ions in said material being chosen to achieve an electrical conductivity of said material, in a direction which is substantially perpendicular to said first and said surfaces, equal to or less than about $2 \times 10^{-8}$ Siemen's units per centimeter (S/cm).

2. The device of claim 1, wherein said electrical conductivity is equal to or less than about $2 \times 10^{-9}$ S/cm.

3. The device of claim 1, further comprising a polarizer in optical communication with said first end and an analyzer in optical communication with said second end.

4. The device of claim 3, still further comprising a source of electromagnetic radiation in optical communication with said polarizer.

5. The device of claim 1, further comprising a source of electromagnetic radiation in optical communication with said first end.

6. A device, comprising:
   a region of substantially single-crystal material having a composition which includes $KTiOPO_4$, the Ti in the crystal lattice of said material being in ionic form and having a valence of +4, said region including first and second substantially parallel surfaces and first and second ends; and
   a first electrical contact in electrical contact with said first surface and a second electrical contact in electrical contact with said second surface, characterized in that
   said Ti is partially substituted with one or more dopant ions having a valence of +3 or +2 and an ionic radius which is within 50 percent of the ionic radius of said Ti, the concentration of said one or more dopant ions in said material being chosen to achieve an electrical conductivity of said material, in a direction which is substantially perpendicular to said first and second surfaces, equal to or less than about $2 \times 10^{-8}$ Siemen's units per centimeter (S/cm).

7. The device of claim 6, wherein said electrical conductivity is equal to or less than about $2 \times 10^{-9}$ S/cm.

8. The device of claim 6, further comprising a polarizer in optical communication with said first end and an analyzer in optical communication with said second end.

9. The device of claim 8, still further comprising a source of electromagnetic radiation in optical communication with said polarizer.

10. The device of claim 6, further comprising a source of electromagnetic radiation in optical communication with said first end.

11. A device, comprising:
    a substrate of substantially single-crystal material having a composition which includes $KTiOPO_4$, the Ti in the crystal lattice of said material being in ionic form and having a valence of +4, said substrate including first and second surfaces; and at least a first channel waveguide formed in said first surface of said substrate, characterized in that said Ti is partially substituted with one or more dopant ions having a valence of +3, +2 or +1 and an ionic radius which is within 50 percent of the ionic radius of said Ti, the concentration of said one or more dopant ions in said material being chosen to achieve an electrical conductivity of said material equal to or less than about $2 \times 10^{-8}$ Siemen's units per centimeter (S/cm).

12. The device of claim 11, wherein said electrical conductivity is equal to or less than about $2 \times 10^{-9}$ S/cm.

13. The device of claim 11, further comprising first and second electrical contacts positioned on said first surface on opposite sides of said at least first channel waveguide and in electrical contact with said substrate.

14. The device of claim 11, further comprising a first electrical contact positioned on said first surface and overlying said at least first channel waveguide and a second electrical contact positioned on said second surface, said first and second electrical contacts being in electrical contact with said substrate.

15. The device of claim 11, further comprising a second channel waveguide formed in said first surface.

16. A device, comprising:

a substrate of substantially single-crystal material having a composition which includes $KTiOPO_4$, the Ti in the crystal lattice of said material being in ionic form and having a valence of +4, said substrate including first and second surfaces; and at least a first channel waveguide formed in said first surface of said substrate, characterized in that said Ti is partially substituted with one or more dopant ions having a valence of +3 or +2 and an ionic radius which is within 50 percent of the ionic radius of said Ti, the concentration of said one or more dopant ions in said material being chosen to achieve an electrical conductivity of said material equal to or less than about $2 \times 10^{-8}$ Siemen's units per centimeter (S/cm).

17. The device of claim 16, wherein said electrical conductivity is equal to or less than about $2 \times 10^{-9}$ S/cm.

18. The device of claim 16, further comprising first and second electrical contacts positioned on said first surface on opposite sides of said at least first channel waveguide and in electrical contact with said substrate.

19. The device of claim 16, further comprising a first electrical contact positioned on said first surface and overlying said at least first channel waveguide and a second electrical contact positioned on said second surface, said first and second electrical contacts being in electrical contact with said substrate.

20. The device of claim 16, further comprising a second channel waveguide formed in said first surface.

21. In a process for producing a single crystal of $MTiOXO_4$, wherein M is selected from the group consisting of K, Rb, and Tl, X is selected from the group consisting of P and As, comprising the steps of preparing a substantially isothermal melt containing the components for forming $MTiOXO_4$ crystals and a flux comprising oxides of M and X; suspending a seed crystal of $MTiOXO_4$ in the melt; slowly decreasing the temperature of the melt; and continuing decreasing the temperature until crystallization of the crystalline composition is completed; an improvement for reducing the ionic conductivity of the single crystal comprising adding to the flux at least about 0.5 mole percent total of at least one dopant selected from the group consisting of Ga, Al and Si, calculated as the oxide and based upon the total moles of $MTiOXO_4$ crystals formable from the components in the melt; and controlling the crystallizing temperature to provide a doped single crystal of $MTiOXO_4$ which contains said dopant in an amount, totaling at least about 100 ppm, effective to reduce the ionic conductivity of the single crystal compared to a single crystal prepared without adding said dopant.

22. The improved process of claim 21 wherein the temperature of the melt when the seed crystal is suspended therein is within the range of from about 700° C. to about 990° C.; and wherein mixing is provided during crystallization.

23. A composition of matter, comprising:

substantially single-crystal material having a composition which includes $KTiOPO_4$, the Ti in the crystal lattice of said material being in ionic form and having a valence of +4, characterized in that said Ti is partially substituted with one or more dopant ions having a valence of +3, +2 or +1 and an ionic radius which is within 50 percent of the ionic radius of said Ti, said dopant ions including chromium ions and the concentration of said one or more dopant ions in said material being chosen to achieve an electrical conductivity of said material equal to or less than about $2 \times 10^{-8}$ Siemen's units per centimeter (S/cm).

24. A composition of matter, comprising:

substantially single-crystal material having a composition which includes $KTiOPO_4$, the Ti in the crystal lattice of said material being in ionic form and having a valence of +4, characterized in that said Ti is partially substituted with one or more dopant ions having a valence of +3, +2 or +1 and an ionic radius which is within 50 percent of the ionic radius of said Ti, said dopant ions including magnesium ions and the concentration of said one or more dopant ions in said material being chosen to achieve an electrical conductivity of said material equal to or less than about $2 \times 10^{-8}$ Siemen's units per centimeter (S/cm).

25. A composition of matter, comprising:

substantially single-crystal material having a composition which includes $KTiOPO_4$, the Ti in the crystal lattice of said material being in ionic form and having a valence of +4, characterized in that said Ti is partially substituted with one or more dopant ions having a valence of +3 or +2 and an ionic radius which is within 50 percent of the ionic radius of said Ti, said dopant ions including chromium ions and the concentration of said one or more dopant ions in said material being chosen to achieve an electrical conductivity of said material equal to or less than about $2 \times 10^{-8}$ Siemen's units per centimeter (S/cm).

26. A composition of matter, comprising:

substantially single-crystal material having a composition which includes $KTiOPO_4$, the Ti in the crystal lattice of said material being in ionic form and having a valence of +4, characterized in that said Ti is partially substituted with one or more dopant ions having a valence of +3 or +2 and an ionic radius which is within 50 percent of the ionic radius of said Ti, said dopant ions including magnesium ions and the concentration of said one or more dopant ions in said material being chosen to achieve an electrical conductivity of said material equal to or less than about $2 \times 10^{-8}$ Siemen's units per centimeter (S/cm).

27. In a process for producing a single-crystal layer of $KTiOPO_4$, comprising the steps of preparing a substantially isothermal melt containing the components for forming $KTiOPO_4$ crystals and a flux comprising oxides of K and P; suspending a seed crystal of $KTiOPO_4$ in the melt; slowly decreasing the temperature of the melt; and continuing decreasing the temperature until crystallization of the crystalline composition is completed; an improvement for reducing the ionic conductivity of the single crystal comprising adding to the flux at least about 0.5 mole percent total of at least one dopant selected from the group consisting of Ga, Al, Cr, and Mg calculated as the oxide and based upon the total moles of $KTiOPO_4$ crystals formable from the components in the melt; and controlling the crystallizing temperature to provide a doped single-crystal of $KTiOPO_4$ which contains said dopant in an amount totalling at least abut 100 ppm, effective to reduce the ionic conductivity of the single crystal prepared without adding said dopant.

28. In a process for producing a single crystal of $KTiOPO_4$, comprising the steps of preparing a substantially isothermal melt containing the components for forming $KTiOPO_4$ crystals and a flux comprising oxides of K and P; suspending a seed crystal of $KTiOPO_4$ in the melt; slowly decreasing the temperature of the melt; and continuing decreasing the temperature until crystallization of the crystalline composition is completed; an improvement for reducing the ionic conductivity of the single crystal comprising adding to the flux at least one dopant selected as the oxide from the group consisting of Ga and Al, such that the dopant to Ti atomic ratio in solution being at least $3.11 \times 10^{-2}$; and controlling the crystallizing temperature to provide a doped single crystal of $KTiOPO_4$ which contains said dopant in an amount, totaling at least about 100 ppm, effective to reduce the ionic conductivity of the single crystal compared to a single crystal prepared without adding said dopant.

29. A process for producing a doped single crystal of $KTiOPO_4$, comprising the steps of preparing a substantially isothermal melt containing the components for forming $KTiOPO_4$ crystals and a flux comprising oxides of K and P; adding to the flux at least one dopant selected as the oxide from the group consisting of Ga and Al, such that the dopant to Ti atomic ratio in solution being at least $3.11 \times 10^{-2}$; suspending a seed crystal of $KTiOPO_4$ in the melt; slowly decreasing the temperature of the melt while maintaining substantially isothermal conditions therein; and continuing decreasing the temperature until crystallization of the crystalline composition is completed while controlling the crystallizing temperature to provide a doped single crystal of $KTiOPO_4$ which contains at least about 100 ppm of said dopant.

30. A process for producing a doped single crystal of $KTiOPO_4$, comprising the steps of preparing a substantially isothermal melt containing the components for forming $KTiOPO_4$ crystals and a flux comprising oxides of K and P; adding to the flux at least one dopant selected as the oxide from the group consisting of Ga and Al, such that the dopant to Ti atomic ratio in solution being at least $3.11 \times 10^{-2}$; suspending a seed crystal of $KTiOPO_4$ in the melt; slowly decreasing the temperature of the melt while maintaining substantially isothermal conditions therein; and continuing decreasing the temperature until crystallization of the crystalline composition is completed while controlling the crystallizing temperature to provide a doped single crystal of $KTiOPO_4$ which contains at least 200 ppm of said dopant.

31. In a process for producing a single crystal of $KTiOPO_4$, comprising the steps of preparing a substantially isothermal melt containing the components for forming $KTiOPO_4$ crystals and a flux comprising oxides of K and P; suspending a seed crystal of $KTiOPO_4$ in the melt; slowly decreasing the temperature of the melt; and continuing decreasing the temperature until crystallization of the crystalline composition is complete; an improvement for reducing the ionic conductivity of the single crystal comprising adding to the flux at least one dopant selected as the oxide from the group consisting of Ga, Al, Cr, and Mg, such that the dopant to Ti atomic ratio in the solution is at least $5.26 \times 10^{-4}$; and controlling the crystallizing temperature to provide a doped single crystal of $KTiOPO_4$ which contains said dopant in an amount totaling at least about 100 ppm, effective to reduce the ionic conductivity of the single crystal compared to a single crystal prepared without adding said dopant.

32. A doped single-crystal of $KTiOPO_4$ containing at least about 100 ppm of a dopant selected from the group consisting of Cr, Mg and mixtures thereof.

* * * * *